(12) United States Patent
Lee

(10) Patent No.: US 7,999,285 B2
(45) Date of Patent: *Aug. 16, 2011

(54) INSULATED GATE BIPOLAR TRANSISTOR AND METHOD FOR MANUFACTURING THE SAME

(75) Inventor: Sang Yong Lee, Bucheon-si (KR)

(73) Assignee: Dongby Hitek Co., Ltd., Seoul (KR)

( * ) Notice: Subject to any disclaimer, the term of this patent is extended or adjusted under 35 U.S.C. 154(b) by 338 days.

This patent is subject to a terminal disclaimer.

(21) Appl. No.: 12/199,966

(22) Filed: Aug. 28, 2008

(65) Prior Publication Data

US 2009/0057710 A1 Mar. 5, 2009

(30) Foreign Application Priority Data

Aug. 30, 2007 (KR) .................. 10-2007-0087562

(51) Int. Cl.
*H01L 21/331* (2006.01)

(52) U.S. Cl. . 257/139; 257/147; 257/152; 257/E21.382; 438/135; 438/141

(58) Field of Classification Search .................. 257/139, 257/147, 152, 153, E27.197, E21.382, 500; 438/135, 141

See application file for complete search history.

(56) References Cited

U.S. PATENT DOCUMENTS

| 5,014,101 A | * | 5/1991 | Finney | 257/139 |
| 5,728,593 A | * | 3/1998 | Yun et al. | 438/141 |
| 5,838,027 A | * | 11/1998 | Kim et al. | 257/139 |
| 5,891,776 A | * | 4/1999 | Han et al. | 438/274 |
| 6,222,248 B1 | * | 4/2001 | Fragapane | 257/565 |

FOREIGN PATENT DOCUMENTS

| CN | 1374703 A | 10/2002 |
| JP | 10-290011 | 10/1998 |
| KR | 10-0163875 | 12/1998 |

* cited by examiner

*Primary Examiner* — Thinh T Nguyen
(74) *Attorney, Agent, or Firm* — Saliwanchik, Lloyd & Eisenschenk

(57) ABSTRACT

An insulated gate bipolar transistor according to an embodiment includes a first conductive type collector ion implantation area in a substrate; a second conductive type buffer layer, including a first segment buffer layer and a second segment buffer layer, on the first conductive collector ion implantation area; a first conductive type base area on the second conductive type buffer layer; a gate on the substrate at a side of the first conductive type base area; a second conductive type emitter ion implantation area in the first conductive type base area; an insulating layer on the gate; an emitter electrode electrically connected to the second conductive type emitter ion implantation area; and a collector electrode electrically connected to the first conductive collector ion implantation area. The first segment buffer layer can be aligned below a portion of the base area and can have a lower density of second conductive type ions than that of the second segment buffer layer adjacent the first segment buffer layer.

5 Claims, 4 Drawing Sheets

INSULATED GATE BIPOLAR TRANSISTOR AND METHOD FOR MANUFACTURING THE SAME

CROSS-REFERENCE TO RELATED APPLICATION

The present application claims the benefit under 35 U.S.C. §119 of Korean Patent Application No. 10-2007-0087562, filed Aug. 30, 2007, which is hereby incorporated by reference in its entirety.

BACKGROUND

An insulated gate bipolar transistor (IGBT) is a device having the advantageous characteristics of an insulated gate structure of a metal oxide semiconductor (MOS) transistor and the high current density of a bipolar transistor.

In contrast to the MOS transistor, a conventional IGBT has a parasitic PNPN thyristor structure including a collector P, a drift region N, a base P and an emitter N.

However, if the sum of current gains of an NPN transistor and a PNP transistor provided in an equivalent circuit is equal to or greater than 1, a PNPN thyristor is turned on, so that turn-off performance by the gate may deteriorate, which is called latch-up.

Such a latch-up may restrict an SOA (safe operation area) of the IGBT and cause over current so that devices may be damaged.

Thus, there exists a need in the art for an improved IGBT.

BRIEF SUMMARY

Embodiments of the present invention provide an insulated gate bipolar transistor and methods for manufacturing the same, capable of inhibiting the parasitic thyristor latch-up while minimizing the forward voltage drop.

An insulated gate bipolar transistor according to an embodiment can include a first conductive type collector ion implantation area in a substrate; a second conductive type buffer layer on the first conductive type collector ion implantation area wherein the second conductive type buffer layer comprises a first segment having a first density of second conductive type ions and a second segment having a second density of second conductive type ions higher than the first density; a drift region; a first conductive type base area in the drift region; a gate on the substrate at a side of the first conductive type base area; a second conductive type emitter ion implantation area in the first conductive type base area; an insulating layer on the gate; an emitter electrode electrically connected to the second conductive type emitter ion implantation area; and a collector electrode electrically connected to the first conductive type collector ion implantation area.

A method for forming an insulated gate bipolar transistor according to an embodiment can include forming a collector ion implantation area by implanting first conductive type ions into a substrate; forming a buffer layer by implanting second conductive type ions into the substrate, the forming of the buffer layer including forming a first segment buffer layer and a second segment buffer layer on the collector ion implantation area; forming a base area on the substrate by implanting first conductive type ions into the substrate above the buffer layer; forming a gate on the substrate at one side of the base area; forming an emitter ion implantation area in the base area by implanting second conductive type ions; forming an insulating layer surrounding the gate; forming an emitter electrode electrically connected to the emitter ion implantation area; and forming a collector electrode electrically connected to the collector ion implantation area.

According to the insulated gate bipolar transistor and the method for manufacturing the same of embodiments, the ion density of segments of the buffer layer may vary depending on regions thereof, so that the amount of hole current, which is injected through the segment buffer layers, may vary depending on the regions.

Therefore, the parasitic thyristor latch-up can be inhibited while minimizing the forward voltage drop by increasing latch-up current through reducing the amount of hole current injected into a resistance region Rp of the base, which is the cause of the latch-up.

DETAILED DESCRIPTION

Hereinafter, embodiments of an insulated gate bipolar transistor and a method for manufacturing the same will be described in detail with reference to accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Although in the following description a first conductive type is referring to a P-type and a second conductive type is referring to an N-type, embodiments are not limited thereto.

Figure 1:
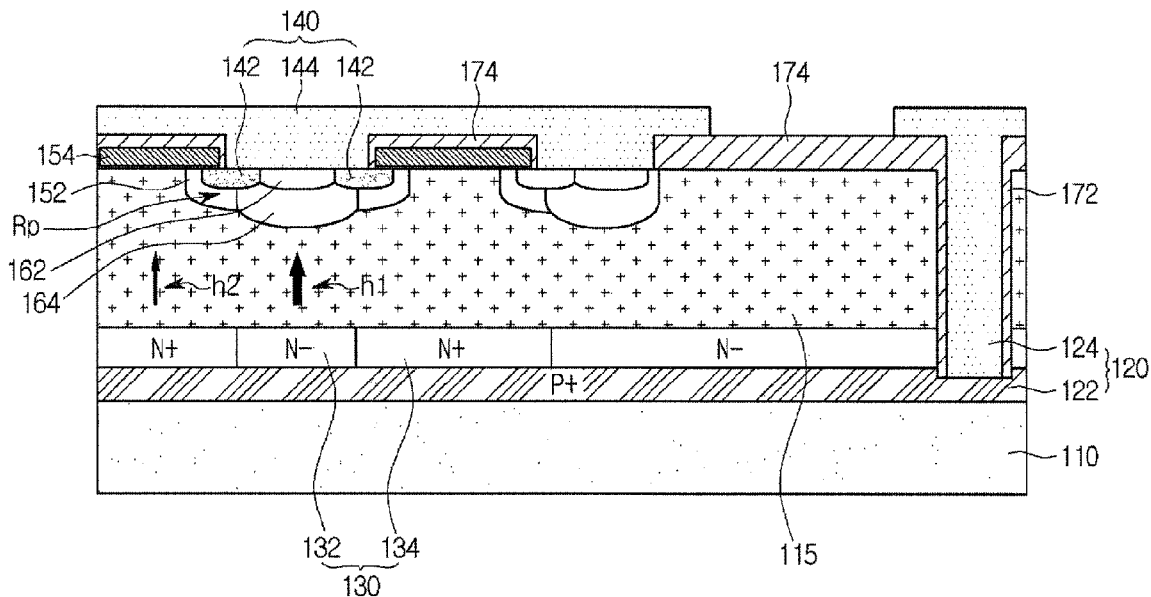
FIG. 1 is a cross-sectional view of an insulated gate bipolar transistor according to an embodiment of the present invention.

FIG. 1 is a cross-sectional view of an insulated gate bipolar transistor according to an embodiment.

Referring to FIG. 1, an insulated gate bipolar transistor can include a first conductive type collector ion implantation area 122 on a substrate 110, a second conductive type buffer layer 130 including a first segment buffer layer 132 and a second segment buffer layer 134 on the first conductive type collector ion implantation area 122, a drift area 115 on the second conductive type buffer layer 130, a first conductive type base area 152 on the drift area 115, a gate 154 on the substrate 110 at a side of the first conductive type base area 152, a second conductive type emitter ion implantation area 142 in the first conductive type base area 152, an insulating layer 174 on the gate 154, an emitter electrode 144 electrically connected to the second conductive type emitter ion implantation area 142, and a collector electrode 124 electrically connected to the first conductive type collector ion implantation area 122.

According to an embodiment, the insulated gate bipolar transistor can be driven by supplying current to the drift area 115 through a channel aligned below the gate 154 in a PNP transistor structure including the first conductive type base area 152, the second conductive type drift area 115, and the first conductive type collector ion implantation area 122.

That is, since the insulated gate bipolar transistor is driven by using a MOS gate, the insulated gate bipolar transistor can be easily driven as compared with a power bipolar device. In addition, minority carriers injected from the collector are subject to conductivity modulation, so that voltage drop is reduced at the drift region, thereby minimizing power consumption.

In addition, according to an embodiment, a first conductive type first ion implantation area 162 can be formed in the emitter ion implantation area 142 in the base area 152. In this case, electric resistance relative to the emitter electrode 144 can be reduced.

In a further embodiment, a first conductive type second ion implantation area 164 can be formed below the first ion implantation area 162. If the first conductive type second ion implantation area 164 having high density (concentration) is formed at a lower portion of the base area 152, resistance Rp is reduced at a lower end of the base area 152, so that the level for current to reach before causing latch-up may increase.

According to an embodiment, the buffer layer 130 can include a first segment buffer layer 132 that is aligned below the second ion implantation area 164 and a second segment buffer layer 134 at lateral sides of the first segment buffer layer 132.

In this case, the density of the first segment buffer layer 132 is lower than that of the second segment buffer layer 134.

According to embodiments, the buffer layer 130 inhibits yield phenomenon caused by punch-through between the emitter 140 and the collector 120 and restricts injection of holes from the collector electrode 124 to the drift area 115, so that the turn-off time is reduced and the level for current to reach before causing latch-up is increased.

However, if the density of the buffer layer 130 is too high, forward voltage drop may increase. Accordingly, the density of the buffer layer 130 can vary depending on regions thereof to reduce the forward voltage drop.

In addition, as shown in FIG. 1, hole current flow through the first and second segment buffer layers 132 and 134 is represented as h1, and h2, respectively.

The buffer layer 130 according to an embodiment has segment buffer layers with different densities depending on regions thereof.

By utilizing the different segment buffer layers 132, 134, hole current h2 injected into a resistance area Rp at the lower end portion of the base area 152, which is the main cause of the latch-up, is reduced. In addition, hole current h1 injected into the second ion implantation area 164 (Deep P+), which rarely exerts influence upon the latch-up, is relatively increased.

Thus, the hole current flows to the emitter electrode 144 through the base area 152 without flowing through the resistance area Rp, which is the cause of the latch-up, so that the level of the current required to cause latch-up is increased. This results in an increased current ability before causing latch-up to occur.

In addition, according to an embodiment, the collector electrode 124 can be formed in a trench T, through which the collector ion implantation area 122 is selectively exposed. A lateral insulating layer 172 can be formed at a side of the trench to electrically block the collector electrode 124 from the buffer layer 130 and the drift area 115 of the substrate 110.

According to the insulated gate bipolar transistor of the embodiment, the density of the segment buffer layer 130 can be formed with different concentrations depending on regions thereof, so that the amount of hole current injected through the buffer layer 130 can also vary depending on the regions. Thus, the amount of hole current injected into the resistance area Rp of the base, which is the cause of the latch-up, is relatively reduced. Therefore, the level for current to reach before causing latch-up is increased and the forward voltage drop is reduced, thereby inhibiting parasitic thyristor latch-up.

Hereinafter, a method for manufacturing an insulated gate bipolar transistor according to an embodiment will be described with reference to FIGS. 2 to 7.

Figure 2:
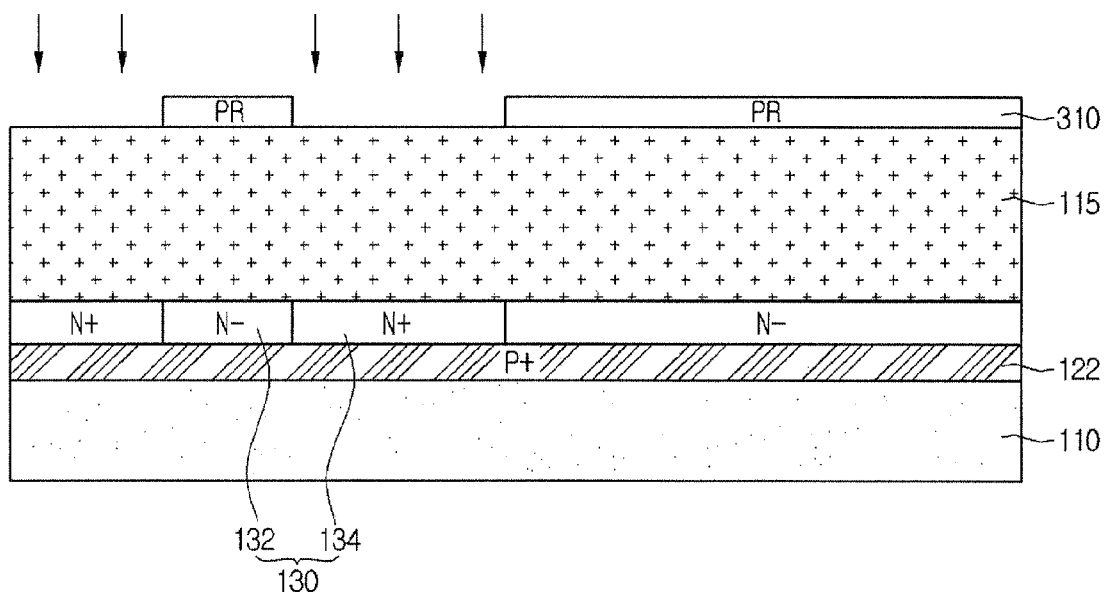
FIGS. 2 to 7 are cross-sectional views illustrating a method of manufacturing an insulated gate bipolar transistor according to an embodiment of the present invention.

As shown in FIG. 2, a collector ion implantation area 122 can be formed by implanting first conductive type ions into a substrate 110. For example, heavily doped P-type ions can be implanted into the substrate 110 to form the collector ion implantation area 122 in the substrate 110. A drift region 115 can be formed on the substrate 110. In one embodiment, the drift region can be an N-type epitaxial layer.

Then, a first segment buffer layer 132 can be formed on the collector ion implantation area 122 by implanting second conductive type ions. For example, lightly doped N type ions can be implanted to form the first segment buffer layer 132.

Figure 3:
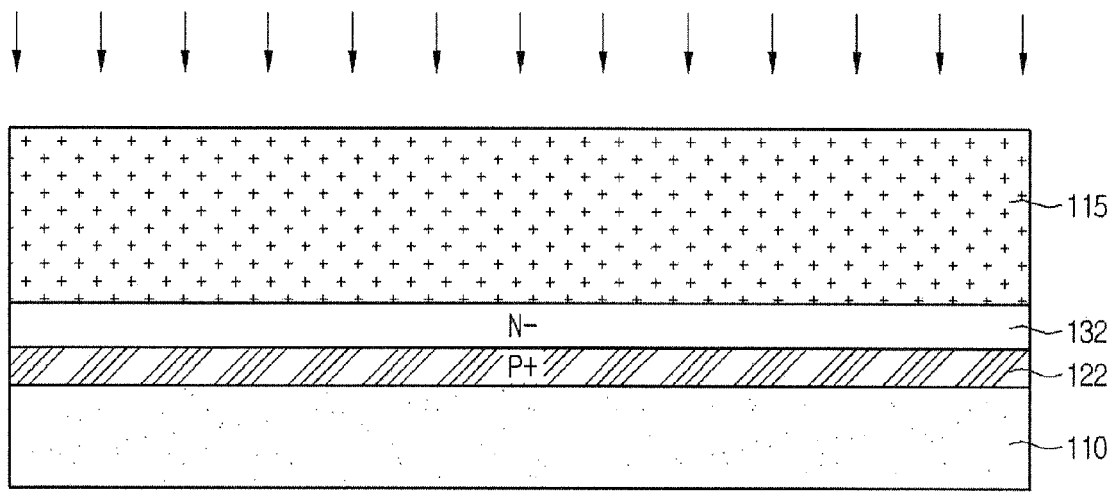

After that, as shown in FIG. 3, a second segment buffer layer 134 can be formed in a portion of the first segment buffer layer 132 by implanting second conductive type ions using a photoresist layer pattern 310 as a mask. For example, heavily doped N type ions can be implanted to form the second segment buffer layer 134 in regions of the first segment buffer layer 132 to create highly doped buffer segments.

In an embodiment, the photoresist layer pattern 310 can be designed such that a region for the second ion implantation area 164 (to be formed later) is not exposed.

Accordingly, the dopant density of the buffer layer 130 may vary depending on regions thereof, so that the amount of hole current injected through the buffer layer 130 may also vary depending to the regions.

Figure 4:
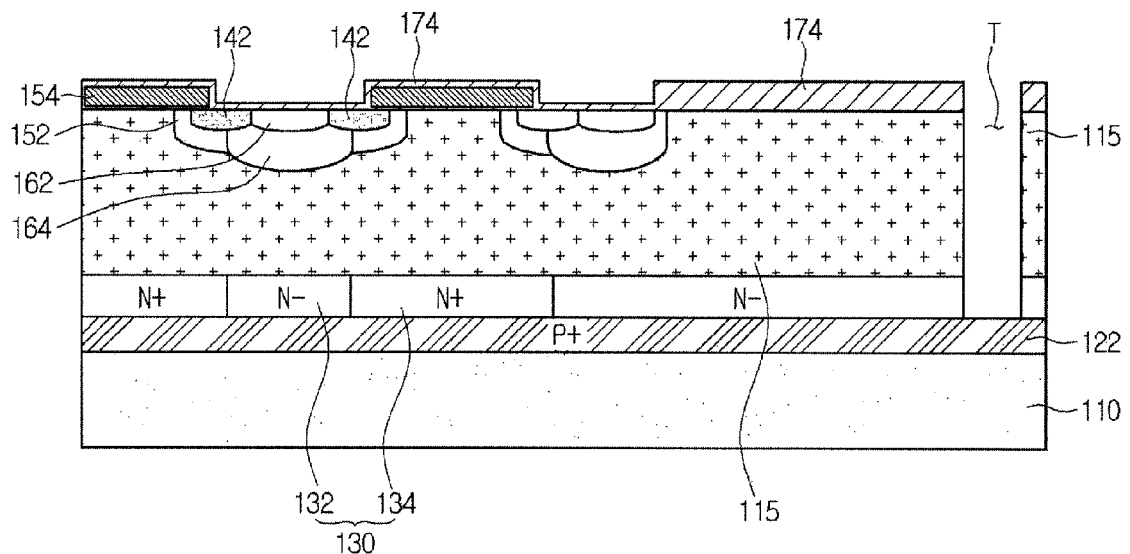

Then, as shown in FIG. 4, the photoresist layer pattern 310 can be removed, and a base area 152 can be formed by implanting first conductive type ions into the substrate 110. For example, P type ions can be implanted into the substrate 110 to form the base area 152.

A second ion implantation area 164 can be formed at a lower portion of the base area 152 and extending into the drift area 115 by implanting first conductive type ions. For example, heavily doped P type ions can be implanted to form the second ion implantation area 164. According to embodiments, the first conductive type second ion implantation area 164 having high density is formed at the lower portion of the base 152, so that resistance Rp is reduced at the lower end of the base area, thereby increasing the level for current to reach before causing the latch-up.

The second ion implantation area 164 can be positioned aligned directly above the first segment buffer layer 132.

A gate 154 can be formed on the substrate 110 at a side of the base area 152.

Then, an emitter ion implantation area 142 can be formed in the base area 152 by implanting second conductive type ions. For example, heavily doped N type ions can be implanted to form the emitter ion implantation area 142.

Then, a first ion implantation area 162 can be formed in the emitter ion implantation area 142 by implanting first conductive type ions into a portion of the base area 152. The first ion implantation area 162 can be formed at an upper portion of the second ion implantation area 164. For example, heavily doped P type ions can be implanted to form the first ion implantation area 162.

An insulating layer 174 surrounding the gate 154 can be formed. The insulating layer 174 can include an insulating film, such as an oxide film or a nitride film. The insulting layer 174 can be formed through a deposition process and can be etched relative to an emitter area.

Figure 5:
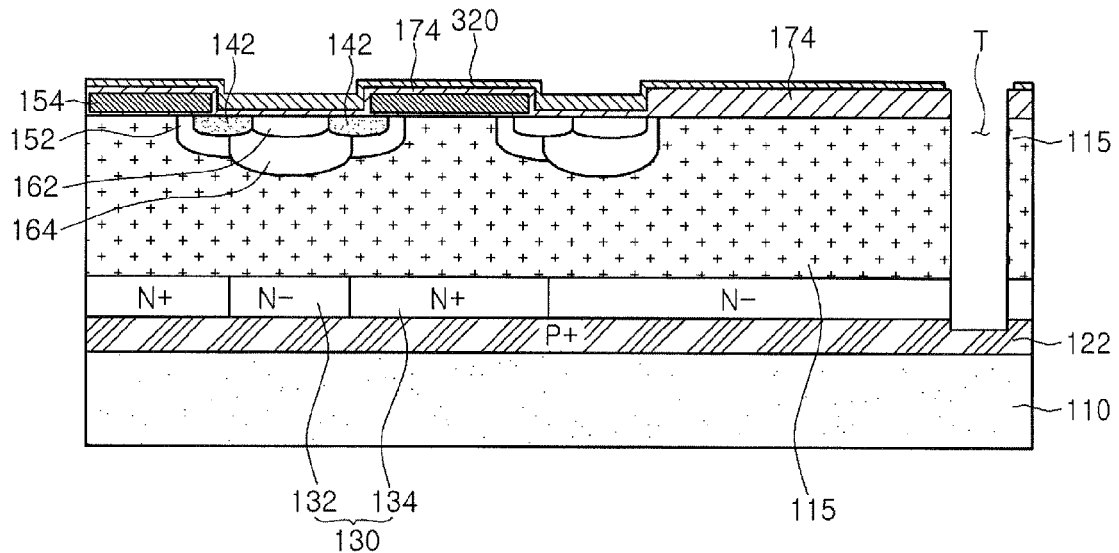

Next, as shown in FIG. 5, a nitride layer 320 can be formed on the insulating layer 174, and a trench T can be formed by selectively etching the nitride layer 320, the insulating layer 174 and the substrate 110 to expose a portion of the collector ion implantation area 122.

Figure 6:
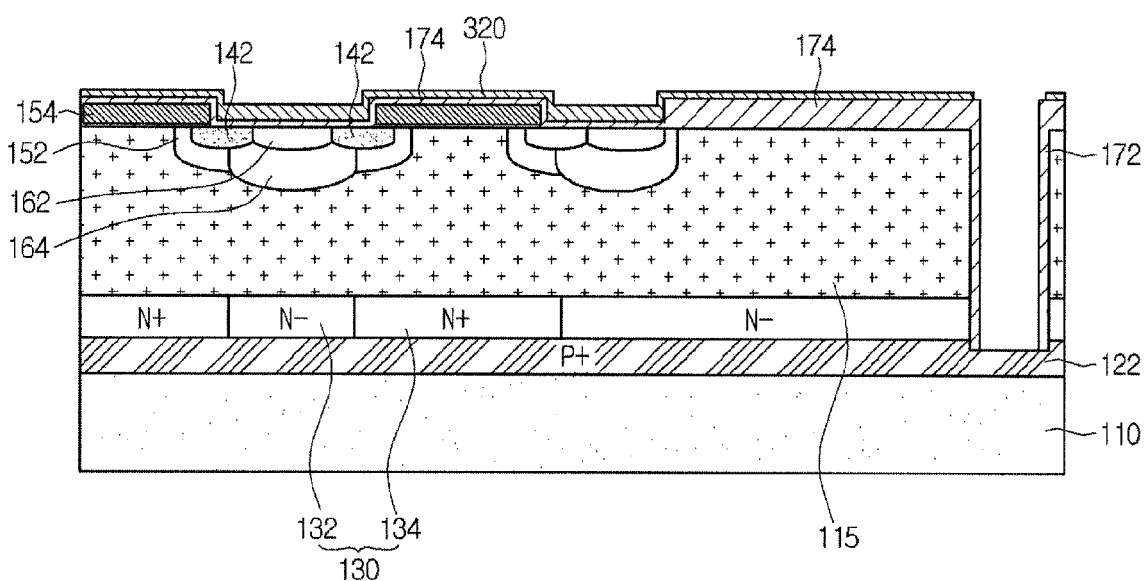

Then, as shown in FIG. 6, the substrate 110 formed with the trench T is oxidized to form an insulating layer 172 on the surfaces of the trench. At this time, the nitride layer 320 can serve as a buffer.

After that, the insulating layer formed at a lower portion of the trench T is subject to an anisotropic etching process such that a lateral insulating layer 172 remains in the trench, which selectively exposes the collector ion implantation area 122. At this time, the nitride layer 320 can again serve as a buffer during the etching process.

Figure 7:
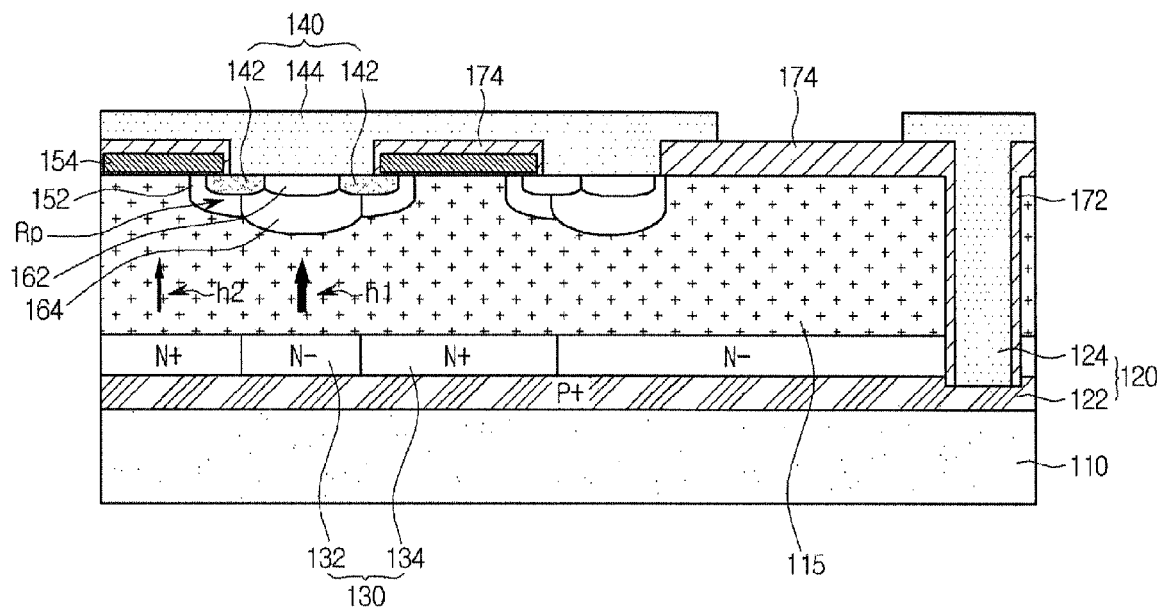

Then, as shown in FIG. 7, the nitride layer 320 can be removed and the emitter ion implantation area 142 can be exposed to form the emitter electrode 144 electrically connected to the emitter ion implantation area 142.

At this time, the process of forming the collector electrode 142, which is filled in the trench and electrically connected to the collector ion implantation area 122, can be performed simultaneously with the process of forming the emitter electrode 144.

According to embodiments, hole current h2 injected into the resistance area Rp at the lower end portion of the base area 152, which is the main cause of the latch-up, is reduced and hole current h1 injected into the second ion implantation area 164 (Deep P+), which rarely exerts influence upon the latch-up, is relatively increased.

Thus, according to embodiments, the hole current flows to the emitter electrode 144 through the base area 152 without flowing through the resistance area Rp, which is the cause of the latch-up, so that the level for current to reach before causing latch-up is increased.

According to embodiments of the method for manufacturing the insulated gate bipolar transistor, dopant density of the segment buffer layer 130 can be intentionally varied depending on regions thereof, so that the amount of hole current injected through the buffer layer 130 may also vary depending on the regions. Thus, the amount of hole current injected into the resistance area Rp of the base, which is the cause of the latch-up, is relatively reduced. Therefore, the level for current to reach before causing latch-up is increased and the forward voltage drop is reduced, thereby inhibiting parasitic thyristor latch-up.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An insulated gate bipolar transistor comprising:
    a first conductive type collector ion implantation area in a substrate;
    a second conductive type buffer layer on the first conductive type collector ion implantation area, wherein the second conductive type buffer layer comprises a first segment having a first density of second conductive type ions and a second segment having a second density higher than the first density;
    a drift region in the substrate on the second conductivity type buffer layer;
    a first conductive type base area in the drift region;
    a gate on the substrate at a side of the first conductive type base area;
    a second conductive type emitter ion implantation area in the first conductive base area;
    an insulating layer on the gate;
    an emitter electrode electrically connected to the second conductive type emitter ion implantation area;
    a collector electrode electrically connected to the first conductive type collector ion implantation area; and
    a lateral insulating layer at a side of the trench, insulating the collector electrode from the second conductive type buffer layer and the drift area,
    wherein the collector electrode is electrically connected to the first conductive type collector ion implantation area through a trench passing through the drift area and the second conductive type buffer layer of the substrate.

2. The insulated gate bipolar transistor according to claim 1, further comprising a first conductive type first ion implantation area in the emitter ion implantation area.

3. The insulated gate bipolar transistor according to claim 2, further comprising a first conductive type second ion implantation area at a lower portion of the first conductive type first ion implantation area and extending into the drift region.

4. The insulated gate bipolar transistor according to claim 3 wherein the first segment buffer layer is disposed in alignment below the first conductive type second ion implantation area; and wherein the second segment buffer layer is at a side of the first segment buffer layer.

5. The insulated gate bipolar transistor according to claim 1, wherein the trench extends into a portion of the first conductive type collector ion implantation area.

* * * * *

UNITED STATES PATENT AND TRADEMARK OFFICE
CERTIFICATE OF CORRECTION

PATENT NO. : 7,999,285 B2  
APPLICATION NO. : 12/199966  
DATED : August 16, 2011  
INVENTOR(S) : Sang Yong Lee Page 1 of 1

It is certified that error appears in the above-identified patent and that said Letters Patent is hereby corrected as shown below:

Title Page,
(73) Assignee, "Dongby Hitek Co., Ltd." should read --Dongbu Hitek Co., Ltd.--.

Signed and Sealed this
Eleventh Day of October, 2011

David J. Kappos
*Director of the United States Patent and Trademark Office*